United States Patent
Onishi et al.

(10) Patent No.: US 9,805,871 B2
(45) Date of Patent: *Oct. 31, 2017

(54) CERAMIC ELECTRONIC COMPONENT WITH LOW EQUIVALENT SERIES RESISTANCE AND METHOD FOR MANUFACTURING THE SAME

(71) Applicant: Murata Manufacturing Co., Ltd., Nagaokakyo-shi, Kyoto-fu (JP)

(72) Inventors: Kosuke Onishi, Nagaokakyo (JP); Tomohiro Sasaki, Nagaokakyo (JP); Yasuhiro Nishisaka, Nagaokakyo (JP); Akira Ishizuka, Nagaokakyo (JP); Akihiro Yoshida, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 0 days.

This patent is subject to a terminal disclaimer.

(21) Appl. No.: 15/352,670

(22) Filed: Nov. 16, 2016

(65) Prior Publication Data

US 2017/0062136 A1 Mar. 2, 2017

Related U.S. Application Data

(63) Continuation of application No. 14/324,397, filed on Jul. 7, 2014, now Pat. No. 9,530,560.

(30) Foreign Application Priority Data

Jul. 10, 2013 (JP) .................................. 2013-144836
May 22, 2014 (JP) .................................. 2014-105954

(51) Int. Cl.
*H01G 4/30* (2006.01)
*H01G 4/248* (2006.01)
(Continued)

(52) U.S. Cl.
CPC ............... *H01G 4/30* (2013.01); *H01C 7/008* (2013.01); *H01F 27/29* (2013.01); *H01G 4/005* (2013.01);
(Continued)

(58) Field of Classification Search
CPC ........ H01G 4/30; H01G 4/005; H01L 1/0472; H01L 41/293
See application file for complete search history.

(56) References Cited

U.S. PATENT DOCUMENTS 4,701,827 A * 10/1987 Fujikawa ............... H01G 4/008
361/309
4,752,858 A * 6/1988 Yokotani .............. H01G 4/1209
361/321.4
(Continued)

FOREIGN PATENT DOCUMENTS

JP 2002134351 A * 5/2002

OTHER PUBLICATIONS

Onishi et al., "Ceramic Electronic Component With Low Equivalent Series Resistance and Method for Manufacturing the Same", U.S. Appl. No. 14/324,397, filed Jul. 7, 2014.

*Primary Examiner* — David M Sinclair
(74) *Attorney, Agent, or Firm* — Keating & Bennett, LLP

(57) ABSTRACT

External electrodes, electrically connected to exposed portions of internal electrodes, are arranged on end surfaces of a ceramic main body of a laminated ceramic capacitor. Alloy layers of a metal contained in internal electrodes, and a metal contained in external electrodes, are arranged at the boundaries between external electrodes, and the ceramic main body and internal electrodes. Plating layers are provided on surfaces of external electrodes. A ceramic electronic component having a reduced ESR is thus provided.

20 Claims, 3 Drawing Sheets

(51) Int. Cl.
   *H01G 4/005*   (2006.01)
   *H01F 27/29*   (2006.01)
   *H01C 7/00*    (2006.01)
   *H01L 41/047*  (2006.01)
   *H01L 41/293*  (2013.01)
   *H01G 4/008*   (2006.01)
   *H01G 4/12*    (2006.01)
   *H01F 27/28*   (2006.01)

(52) U.S. Cl.
   CPC ............ H01G 4/008 (2013.01); H01G 4/12 (2013.01); H01G 4/248 (2013.01); H01L 41/0472 (2013.01); H01L 41/293 (2013.01); *H01F 27/2804* (2013.01); *H01F 2027/2809* (2013.01)

(56) References Cited

U.S. PATENT DOCUMENTS

| | | | | |
|---|---|---|---|---|
| 5,073,180 A * | 12/1991 | Farooq | ............... | H05K 3/4629 156/89.18 |
| 9,530,560 B2 * | 12/2016 | Onishi | ............... | H01G 4/005 |
| 2002/0006023 A1 * | 1/2002 | Maegawa | ............... | H01G 4/232 361/305 |
| 2004/0179326 A1 * | 9/2004 | Hattori | ............... | H01G 4/008 361/320 |
| 2006/0137488 A1 * | 6/2006 | Sakaue | ............... | B22F 1/0007 75/255 |
| 2006/0245141 A1 * | 11/2006 | Shirasu | ............... | H01G 4/012 361/303 |
| 2009/0296311 A1 * | 12/2009 | Otsuka | ............... | H01G 2/065 361/306.3 |
| 2010/0157506 A1 * | 6/2010 | Togashi | ............... | H01G 4/012 361/303 |
| 2010/0271752 A1 * | 10/2010 | Ishida | ............... | H01G 4/012 361/303 |
| 2011/0267736 A1 * | 11/2011 | Sasabayashi | ............... | H01G 4/005 361/301.1 |
| 2013/0050896 A1 * | 2/2013 | Park | ............... | H01G 4/12 361/321.1 |
| 2014/0146437 A1 * | 5/2014 | Lee | ............... | H01G 4/2325 361/301.4 |

* cited by examiner

CERAMIC ELECTRONIC COMPONENT WITH LOW EQUIVALENT SERIES RESISTANCE AND METHOD FOR MANUFACTURING THE SAME

BACKGROUND OF THE INVENTION

1. Field of the Invention

The present invention relates to a ceramic electronic component and a method for manufacturing the ceramic electronic component, and particularly to a ceramic electronic component such as a laminated ceramic capacitor or a laminated ceramic inductor, for example, and a method for manufacturing such a ceramic electronic component.

2. Description of the Related Art

In recent years, as electronic devices such as portable telephones, portable music players, and the like have decreased in size and thickness, ceramic electronic components mounted on such electronic devices also rapidly continue to decrease in size and thickness. Japanese Patent Laying-Open No. 2012-222276, for example, discloses a laminated-type capacitor whose length dimension L is 1.0 mm, width dimension W is 5.0 mm, and thickness dimension T (height dimension H) is 0.15 mm. Furthermore, Japanese Patent Laying-Open No. 2000-40635 discloses a ceramic electronic component such as a laminated ceramic capacitor or the like, wherein external electrodes are arranged on an element in which internal electrodes are provided in a ceramic material so as to be electrically continuous with the internal electrodes.

As disclosed in Japanese Patent Laying-Open No. 2012-222276 described above, when a height dimension H of the laminated-type capacitor is extremely thin, the area of the internal electrodes is small, and the number of the laminated internal electrodes is also small. As a result, the equivalent series resistance (ESR) of the main body of the laminated-type capacitor increases, which is problematic.

Furthermore, the external electrodes of the laminated ceramic capacitor typically contain a glass component. As disclosed in Japanese Patent Laying-Open No. 2000-40635 described above, for example, during firing of the external electrodes, a glass frit contained in the external electrodes may react with the ceramic component of the ceramic main body, which may cause a reaction layer between the glass and the ceramic to be formed at an interface between the external electrodes and the ceramic main body. If such a reaction layer is formed at the interface between the ceramic main body and the external electrodes, the bonded area between the internal electrodes and the external electrodes may be hindered by the glass in the reaction layer, making the above-described problem of an increased ESR more noticeable.

Furthermore, prior to the formation of the external electrodes, the laminated-type capacitor is typically subjected to treatment in which end surfaces of the ceramic main body are subjected to barrel polishing for exposing the internal electrodes. However, since the laminated-type capacitor with the small height dimension H can easily develop a crack or a chip, it cannot be sufficiently subjected to the treatment for exposing the internal electrodes. It is thus difficult to provide a sufficient bonded area between the internal electrodes and the external electrodes in the laminated-type capacitor with the small height dimension H.

SUMMARY OF THE INVENTION

Accordingly, preferred embodiments of the present invention provide a ceramic electronic component having a reduced ESR and a method for manufacturing such a ceramic electronic component.

A ceramic electronic component according to a preferred embodiment of the present invention includes a ceramic main body including a plurality of laminated ceramic layers, an internal electrode disposed inside the ceramic main body, the internal electrode including an exposed portion exposed at an end surface of the ceramic main body, an external electrode arranged on the end surface of the ceramic main body so as to be electrically connected with the exposed portion of the internal electrode, and a plating film arranged on the external electrode. In the ceramic electronic component according to a preferred embodiment of the present invention, the external electrode includes a metal medium in which metal powder is integrated and a glass medium in which glass powder is integrated; an alloy layer of a metal contained in the external electrode and a metal contained in the internal electrode is arranged at an interface between the external electrode, and the ceramic main body and the internal electrode; and the metal medium and the glass medium are located between the alloy layer and the plating film.

In the ceramic electronic component according to a preferred embodiment of the present invention, the metal medium is preferably made of Cu, for example.

In the ceramic electronic component according to a preferred embodiment of the present invention, the alloy layer is preferably made of an Ni—Cu alloy layer, for example.

In the ceramic electronic component according to a preferred embodiment of the present invention, a coverage ratio of the alloy layer on the end surface of the ceramic main body preferably is about 72% or more, for example.

In the ceramic electronic component according to a preferred embodiment of the present invention, a distance between exposed portions of a plurality of the internal electrodes adjacent to each other on the end surface of the ceramic main body preferably is about 4 µm or less, for example.

In the ceramic electronic component according to a preferred embodiment of the present invention, an exposed ratio of the internal electrode on the end surface of the ceramic main body preferably is about 60% to about 80%, for example.

A method for manufacturing a ceramic electronic component according to yet another preferred embodiment of the present invention is for manufacturing the ceramic electronic component according to other preferred embodiments of the present invention. The method includes the steps of preparing the ceramic main body in which the internal electrode is disposed; applying, to the end surface of the ceramic main body on which the exposed portion of the internal electrode is exposed, a conductive paste containing metal powder having a particle size of about 0.5 µm to about 2 µm and glass powder having a particle size larger than the particle size of the metal powder; and heat-treating the conductive paste to form the external electrode on the end surface of the ceramic main body on which the exposed portion of the internal electrode is exposed, and form the alloy layer at the interface between the external electrode, and the ceramic main body and the internal electrode.

In the method for manufacturing a ceramic electronic component according to a preferred embodiment of the present invention, for example, the glass powder preferably has a softening point higher than a temperature at which the metal contained in the internal electrode diffuses into the metal contained in the external electrode, and a heat-treatment temperature for the conductive paste is higher than the softening point of the glass powder.

In the ceramic electronic component according to a preferred embodiment of the present invention, the alloy layer of the metal contained in the internal electrode and the metal contained in the external electrode is formed at the interface between the external electrode, and the ceramic main body and the internal electrode. This increases the bonded area between the metal contained in the internal electrode and the metal contained in the external electrode, and reduces the connection resistance between the internal electrode and the external electrode. Consequently, according to a preferred embodiment of the present invention, the overall ESR of a ceramic electronic component such as a laminated ceramic capacitor, for example, is significantly reduced.

Consequently, according to various preferred embodiments of the present invention, a ceramic electronic component having reduced ESR is provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
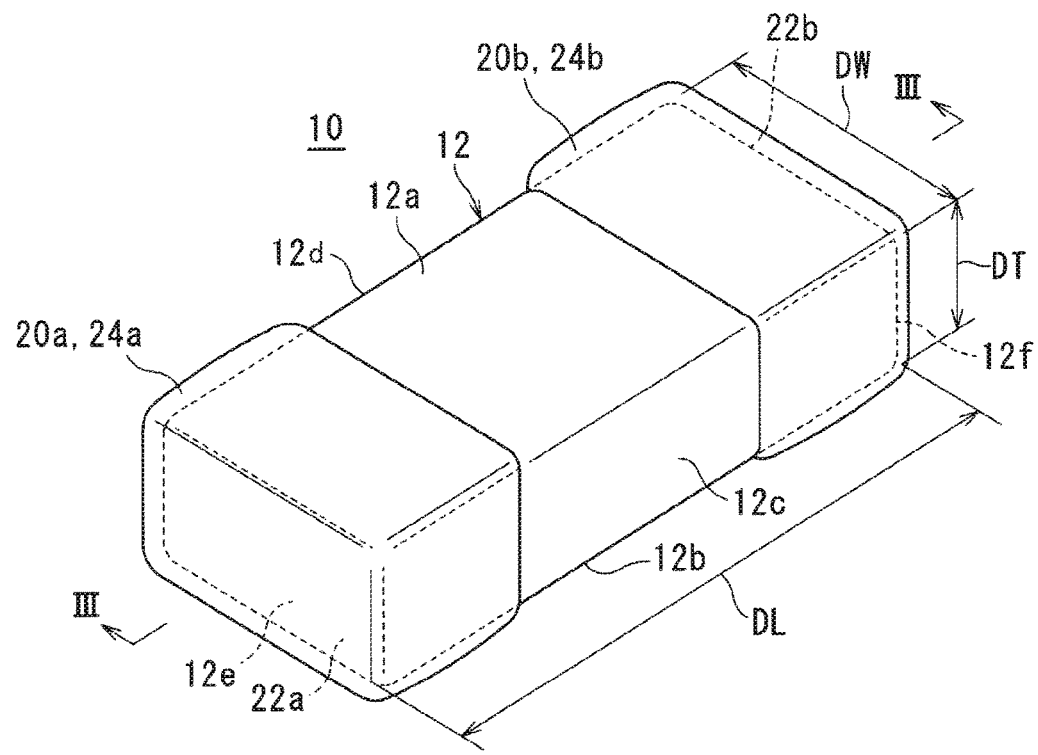
FIG. 1 is a perspective view showing an example of a laminated ceramic capacitor according to a preferred embodiment of the present invention.
Figure 2:
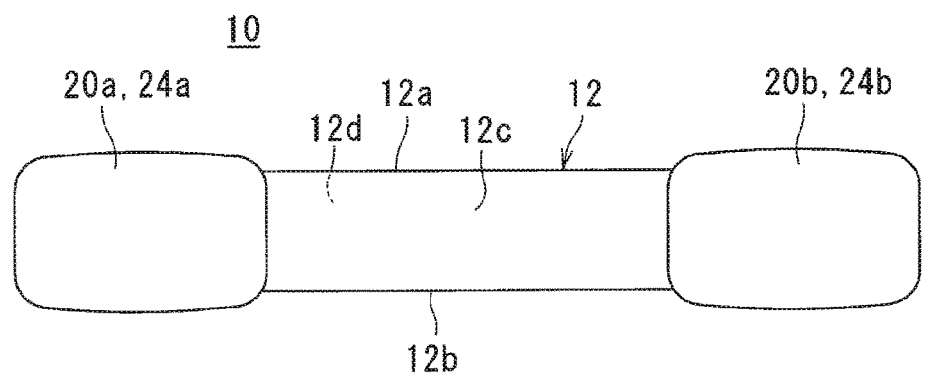
FIG. 2 is a side view of the laminated ceramic capacitor shown in FIG. 1.

A laminated ceramic capacitor 10 shown in FIG. 1 includes a thin ceramic main body 12 having a rectangular or substantially rectangular parallel or substantially parallelepiped shape, for example. Ceramic main body 12 preferably includes a plurality of laminated ceramic layers 14, and includes a pair of main surfaces 12a, 12b opposed to each other, a pair of side surfaces 12c, 12d opposed to each other, and a pair of end surfaces 12e, 12f opposed to each other.

While ceramic main body 12 preferably is configured with the rectangular or substantially rectangular parallel or substantially parallelepiped shape in laminated ceramic capacitor 10 in this preferred embodiment, the shape of ceramic main body 12 is not particularly limited thereto.

Moreover, ceramic main body 12 preferably has rounded corner portions and rounded ridge portions.

Figure 3:
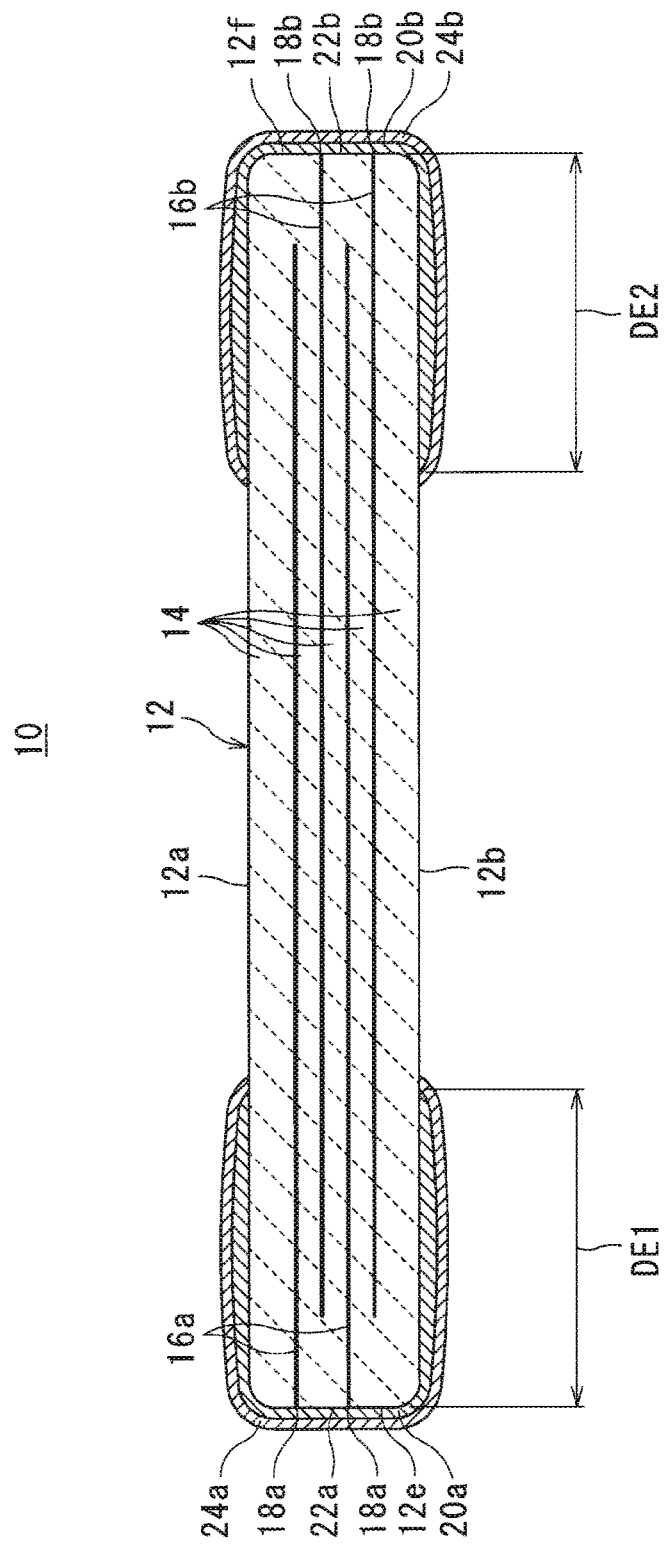
FIG. 3 is a cross-sectional view along the III-III line shown in FIG. 1.

In ceramic main body 12, a length in a direction in which the pair of main surfaces 12a, 12b of ceramic main body 12 are connected (thickness dimension DT; see FIG. 1) corresponds to a length of below-described external electrode 20a (20b) provided on main surfaces 12a, 12b of ceramic main body 12. This length preferably is shorter than a length in which the pair of end surfaces 12e, 12f of ceramic main body 12 are connected (namely, an electrode partial dimension DE1 (electrode partial dimension DE2); see FIG. 3).

While the dimension of ceramic main body 12 is not particularly limited, ceramic main body 12 may be thin such that when DT denotes the thickness dimension, DL denotes the length dimension, and DW denotes the width dimension of ceramic main body 12, $DT<DW<DL$, $(\frac{1}{5}) \times DW \le DT \le (\frac{1}{2}) \times DW$, or $DT<0.3$ mm are satisfied, as shown in FIG. 1. Particularly where $DT<DW<DL$, the thickness of ceramic main body 12 is small and the length of ceramic main body 12 is large, as compared to the width of ceramic main body 12. Where $(\frac{1}{5}) \times DW \le DT \le (\frac{1}{2}) \times DW$, the thickness of ceramic main body 12 is small, i.e., about ⅕ to about ½ of the width of ceramic main body 12. Specifically, the dimensions may be as follows: approximately $0.05 \text{ mm} \le DT < 0.3 \text{ mm}$, $0.4 \text{ mm} \le DL \le 1 \text{ mm}$, and $0.3 \text{ mm} \le DW \le 0.5 \text{ mm}$, for example.

As a ceramic material of ceramic layer 14 of ceramic main body 12, a dielectric ceramic containing $BaTiO_3$, $CaTiO_3$, $SrTiO_3$, $CaZrO_3$, or the like as a main component may be used. A dielectric ceramic further containing, in addition to the above-described main component, a secondary component such as an Mn compound, an Fe compound, a Cr compound, a Co compound, an Ni compound, or the like may also be used.

The thickness of ceramic layer 14 of ceramic main body 12 is preferably about 0.5 μm to about 1.6 μm, for example.

In this preferred embodiment, in each effective portion of ceramic main body 12, a capacitance is generated by below-described internal electrodes 16a, 16b being opposed to each other with ceramic layer 14 made of a dielectric ceramic interposed therebetween. In this way, a ceramic electronic component according to this preferred embodiment defines and functions as a capacitor.

Inside ceramic main body 12, a plurality of first and second internal electrodes 16a, 16b having a rectangular or substantially rectangular shape are alternately arranged at equal distances along a thickness direction of ceramic main body 12.

First and second internal electrodes 16a, 16b include, on one ends thereof, exposed portions 18a, 18b exposed on end surfaces 12e, 12f of ceramic main body 12. Specifically, exposed portion 18a of the one end of first internal electrode 16a is exposed on first end surface 12e of ceramic main body 12. Exposed portion 18b of the one end of second internal electrode 16b is exposed on second end surface 12f of ceramic main body 12.

Each of first and second internal electrodes 16a, 16b is positioned parallel or substantially parallel to first and second main surfaces 12a, 12b of ceramic main body 12. First and second internal electrodes 16a, 16b are opposed to each other with ceramic layer 14 interposed therebetween, in the thickness direction of ceramic main body 12.

The thickness of each of first and second internal electrodes 16a, 16b preferably is about 0.2 μm to about 0.8 μm, for example. A thickness of ceramic layer 14 and a thickness of internal electrode 16a (16b) are preferably designed such that a distance between exposed portions of internal electrodes 16a (16b) on the end surface of ceramic main body 12 becomes about 4 μm or less, for example. In this way, an alloy layer made of a metal of external electrode 20a (20b) and a metal of internal electrode 16a (16b) is more easily formed at an interface between below-described external electrode 20a (20b), and ceramic main body 12 and internal electrode 16a (16b).

First and second internal electrodes 16a, 16b preferably are made of a suitable conductive material. First and second internal electrodes 16a, 16b preferably are made of, for example, a metal such as Ni, Cu, Ag, Pd, Au, or the like, or an alloy containing one of these metals, for example, Ag—Pd alloy.

First and second external electrodes 20a, 20b are arranged on end surfaces 12e, 12f-sides, respectively, of ceramic main body 12. First and second external electrodes 20a, 20b contain a metal medium in which metal powder is integrated and a glass medium in which glass powder is integrated. At the interfaces between external electrodes 20a, 20b, and ceramic main body 12 and internal electrodes 16a, 16b, alloy layers 22a, 22b of the metal contained in external electrodes 20a, 20b and the metal contained in internal electrodes 16a, 16b are provided. The metal medium and the glass medium are present between alloy layers 22a, 22b and below-described plating films 24a, 24b.

First external electrode 20a is arranged to extend from first end surface 12e to the pair of main surfaces 12a, 12b and to the pair of side surfaces 12c, 12d of ceramic main body 12 such that it is electrically connected to exposed portion 18a of first internal electrode 16a. Second external electrode 20b is arranged to extend from second end surface 12f to the pair of main surfaces 12a, 12b and to the pair of side surfaces 12c, 12d of ceramic main body 12 such that it is electrically connected to exposed portion 18b of second internal electrode 16b.

Each of first and second external electrodes 20a, 20b contains the metal powder and the glass powder, thus providing the metal medium and the glass medium.

Cu, Ni, Ag, Pd, Ag—Pd alloy, Au, or the like, for example, can be used as the metal of first and second external electrodes 20a, 20b. Among these, Cu is preferably used, for example.

The metal powder forming the metal medium of first and second external electrodes 20a, 20b preferably has a particle size of about 0.5 μm to about 2 μm, for example. Herein, the mean particle size of the metal powder refers to a particle size at an integrated value of about 50% of a particle size distribution obtained by a laser diffraction/scattering method.

In the present preferred embodiment of the present invention, the mean particle size of the metal powder contained in external electrodes 20a, 20b preferably is about 0.5 μm to about 2 μm, for example, which is smaller than the particle size of the glass powder. As the glass powder, glass powder that is easily wetted with metal powder such as Cu powder is used. This allows ceramic main body 12 and the end surfaces of internal electrodes 16a, 16b to be covered with the metal powder, so as to increase the contact area between the metal (for example, Cu) contained in external electrodes 20a, 20b and the metal (for example, Ni) contained in internal electrodes 16a, 16b. Consequently, on one end surfaces 12e, 12f of ceramic main body 12, the diffusion of the metal of internal electrodes 16a, 16b into the metal of external electrodes 20a, 20b is promoted by internal electrodes 16a, 16b and ceramic main body 12. Moreover, necking of the metal powder contained in external electrodes 20a, 20b is promoted, and necking of the alloy on internal electrodes 16a, 16b and the alloy on adjacent internal electrode 16a, 16b is promoted. In this way, alloy layers 22a, 22b preferably are provided at the interfaces between external electrodes 20a, 20b, and ceramic main body 12 and internal electrodes 16a, 16b. In this preferred embodiment, alloy layers 22a, 22b are preferably provided adjacent to or near internal electrodes 16a, 16b on end surfaces 12e, 12f of ceramic main body 12, but are not provided on main surfaces 12a, 12b and side surfaces 12c, 12d of ceramic main body 12.

The metal powder forming the metal medium of first and second external electrodes 20a, 20b preferably has an aspect ratio of approximately 8 to 15, for example. This is because the use of a flat-shaped powder having an aspect ratio of approximately 8 to 15 increases the void ratio in the external electrode paste, so that in the step of degreasing at the time of firing of external electrodes 20a, 20b, a component such as resin or the like can be easily discharged outside as a gas. Moreover, the metal powder preferably is incorporated into the corner portions of external electrodes 20a, 20b, and hence, the continuity of external electrodes 20a, 20b is significantly improved.

As the particle size of the glass powder of first and second external electrodes 20a, 20b, a particle size larger than the above-described particle size of the metal powder preferably is used. Specifically, the particle size of the glass powder is preferably selected such that a ratio $\underline{b}$ of a glass/Cu powder particle size to a particle size $\underline{a}$ of the metal powder satisfies the relation: $\underline{b} \geq -0.66 \times \underline{a} + 2.32$, for example. That is, in the present preferred embodiment of the present invention, by using the metal powder having a fine particle size and using the glass powder having a particle size larger than that of the metal powder, the specific surface area of the glass is significantly reduced as compared to the specific surface area of the metal powder. This allows ceramic main body 12 and the end surfaces of internal electrodes 16a, 16b to be covered with the metal powder, allowing the alloy layer to be more easily formed. Consequently, the ESR of the ceramic electronic component is significantly reduced.

Furthermore, as stated above, the ESR is also reduced in the laminated ceramic capacitor that cannot be sufficiently subjected to the treatment to expose the internal electrodes prior to the formation of the external electrodes, and specifically, in a laminated ceramic capacitor whose exposed ratio of the internal electrodes on the end surfaces of the ceramic main body is about 60% to about 80%, for example.

In the metal medium contained in first and second external electrodes 20a, 20b, the metal powder of the metal medium has been integrated by being melted by heat treatment at the softening point or higher and subsequently solidified. The metal medium has a continuous portion of about 2 μm or more. The metal medium is thus present so as to fill gaps in the below-described glass medium. Similarly, since the metal powder forming the metal medium is integrated by being solidified, the metal medium is present nearer to the surfaces of external electrodes 20a, 20b than alloy layers 22a, 22b located between external electrodes 20a, 20b, and ceramic main body 12 and internal electrodes 16a, 16b. This increases the contact area between Cu, for example, contained in external electrodes 20a, 20b and Ni, for example, contained in internal electrodes 16a, 16b, so as to promote the formation of the alloy such as Ni—Cu, for example.

In the glass medium contained in first and second external electrodes 20a, 20b, the glass powder of the glass medium has been integrated by being melted by heat treatment at the softening point or higher and subsequently solidified. The glass medium preferably has a continuous portion of about 4 μm or more. The glass medium is thus present so as to fill gaps in the metal medium. Similarly, since the glass powder forming the glass medium is integrated by being solidified, the glass medium is present nearer to the surfaces of external electrodes 20a, 20b than alloy layers 22a, 22b located between external electrodes 20a, 20b, and ceramic main body 12 and internal electrodes 16a, 16b. This allows spatial separation of the glass that otherwise inhibits the diffusion of Ni, for example, contained in internal electrodes 16a, 16b, and Cu, for example, contained in external electrodes 20a, 20b, so as to promote the diffusion of Ni, for example, contained in internal electrodes 16a, 16b, and Cu, for example, contained in external electrodes 20a, 20b.

The proportion of the metal powder in the conductive paste of the first and second external electrodes 20a, 20b is preferably about 60% to about 90% by volume, and more preferably about 70% to about 75% by volume, for example. If the proportion of the metal medium in external electrodes 20a, 20b is less than about 60% by volume, the glass medium may inhibit the diffusion of Ni, for example, of internal electrodes 16a, 16b and Cu, for example, of external electrodes 20a, 20b, leading to reduced contact. On the other hand, if the proportion of the metal medium in external electrodes 20a, 20b exceeds about 90% by volume, the filling ratio of Cu, for example, in external electrodes 20a, 20b may increase, causing cracking of external electrodes 20a, 20b in the degreasing process at the time of firing of external electrodes 20a, 20b. The proportion of the metal medium in external electrodes 20a, 20b of about 70% to about 75% by volume, for example, is more preferable since the ESR will not become high, and external electrodes 20a, 20b will not become cracked.

The proportion of the glass powder in the conductive paste forming first and second external electrodes 20a, 20b is preferably about 10% to about 40% by volume, and more preferably about 25% to about 30% by volume, for example. If the proportion of the glass medium in external electrodes 20a, 20b is less than about 10% by volume, sufficient adhesion between external electrodes 20a, 20b and ceramic main body 12 cannot be obtained, and thus, external electrodes 20a, 20b, during mounting by soldering, may be removed from (external electrodes 20a, 20b may fall off) ceramic main body 12. On the other hand, if the proportion of the glass medium in external electrodes 20a, 20b exceeds about 40% by volume, the glass medium may inhibit the diffusion of Ni contained in the internal electrodes and Cu contained in the external electrodes, leading to reduced contact. The proportion of the glass medium in external electrodes 20a, 20b of about 25% to about 30% by volume, for example, is more preferable since external electrodes 20a, 20b will not fall off, and the contact will not decrease.

The glass forming the glass medium preferably contains one or more network-forming oxides selected from the group consisting of $B_2O_3$ and $SiO_2$, for example, and one or more network-modifying oxides selected from the group consisting of $Al_2O_3$, ZnO, CuO, $Li_2O$, $Na_2O$, $K_2O$, MgO, CaO, BaO, $ZrO_2$, and $TiO_2$.

The glass defining the glass medium preferably contains, as the network-modifying oxide, an oxide of a metal identical to that of the metal powder contained in first and second external electrodes 20a, 20b. In this way, the glass powder contained in first and second external electrodes 20a, 20b is easily wetted with the metal powder contained in first and second external electrodes 20a, 20b.

The glass defining the glass medium preferably contains $SiO_2$ in the largest amount of all the component(s). The proportion of $SiO_2$ in the entire glass is preferably about 35 mol % or more, for example.

The thickness of each of alloy layers 22a, 22b is preferably not less than about 0.2 μm and not more than about 5 μm, for example. If the thickness of alloy layers 22a, 22b is smaller than about 0.2 μm, sufficient continuity of the alloy cannot be obtained, so that the glass may inhibit the diffusion of Ni, for example, contained in internal electrodes 16a, 16b and Cu, for example, contained in external electrodes 20a, 20b, leading to reduced contact. On the other hand, if the thickness of alloy layers 22a, 22b is larger than about 5 μm, there will be no exit for CO gas and $CO_2$ gas produced by the combustion of C remaining more inward than alloy layers 22a, 22b, which may cause blistering.

The coverage ratio of alloy layer 22a (22b) on end surface 12e (12f) of ceramic main body 12 at a 1-μm-thick region is preferably about 72% or more, for example. This is because when the coverage ratio of alloy layer 22a (22b) on end surface 12e (12f) of ceramic main body 12 at the 1-μm-thick region is about 72% or more, for example, the bonded area between the metal contained in internal electrode 16a (16b) and the metal contained in external electrode 20a (20b) is increased, and the connection resistance between internal electrode 16a (16b) and external electrode 20a (20b) is reduced. Consequently, the overall ESR of laminated ceramic capacitor 10 is further reduced. As a method for measuring this coverage ratio, measurement is conducted at a central portion of external electrode 20a (20b) where the amount of glass in external electrode 20a (20b) is the largest. First, a side surface of ceramic main body 12 is polished to a position where the width reduces to ½. In the one external electrode 20a (20b) on the end of the polished cross section, for a region that is about 1 μm forward in the direction from end surface 12e (12f) to external electrode 20a (20b) of ceramic main body 12, the alloy and the glass are divided into white and black regions, respectively, using binarization. The area ratio of the white portions (alloy regions) is subsequently calculated using image processing. The length of the region to be binarized is about 30 μm or more, for example. Then, a value measured at the central portion of external electrode 20a (20b) where the amount of glass in external electrode 20a (20b) is the largest is defined as the coverage ratio of alloy layer 22a (22b) in the entire external electrode 20a (20b), namely, the coverage ratio of alloy layer 22a (22b) on end surface 12e (12f) of ceramic main body 12 at the 1-μm-thick region (namely, the coverage ratio of alloy layer 22a (22b) on end surface 12e (12f) of ceramic main body 12).

Each of alloy layers 22a, 22b as described above is preferably an Ni—Cu alloy layer, for example.

First and second plating films 24a, 24b are arranged on first and second external electrodes 20a, 20b, respectively. In this case, first and second external electrodes 20a, 20b are covered with first and second plating films 24a, 24b. Each of first and second plating films 24a, 24b preferably includes at least one metal selected from the group consisting of Cu, Ni, Sn, Pd, Au, Ag, Pt, Bi, and Zn, or an alloy containing at least one of these metals.

Figure 4:
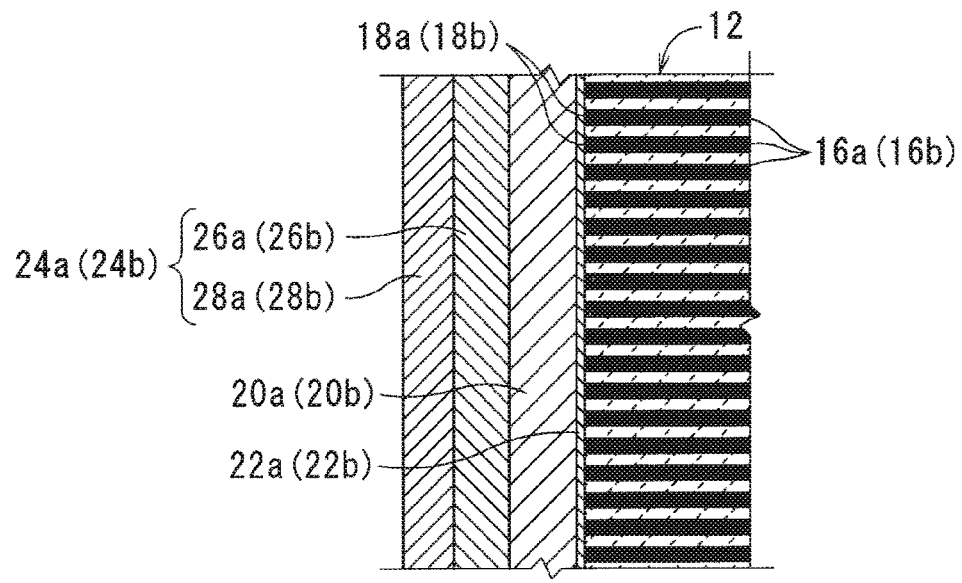
FIG. 4 is a partial enlarged cross-sectional view showing the cross section of a portion of the laminated ceramic capacitor shown in FIG. 1, which includes a ceramic main body, an internal electrode, an alloy layer, an external electrode, and a plating film.
Figure 5:
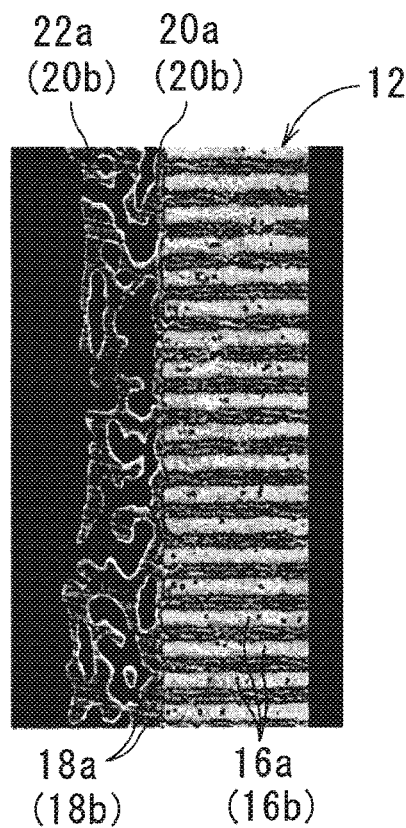
FIG. 5 is an electron microscopic image of the cross section of a cut portion of the laminated ceramic capacitor shown in FIG. 1, prior to the formation of the plating film, which includes the ceramic main body, the internal electrode, the alloy layer, and the external electrode.

Moreover, first and second plating films 24a, 24b may each include a single plating film, or two or more plating films. As shown in FIG. 4, plating film 24a (24b) preferably has a two-layer structure of an Ni plating film 26a (26b) and an Sn plating film 28a (28b). In this case, Ni plating film 26a (26b) functions as a barrier layer, and Sn plating film 28a (28b) functions to improve solderability.

The thickness per plating layer forming each of first and second plating films 24a, 24b is preferably about 1 μm to about 15 μm, for example.

Next, one exemplary method for manufacturing the above-described laminated ceramic capacitor 10 will be described.

First, a ceramic green sheet containing a ceramic material for forming ceramic main body 12 (ceramic layers 14) is prepared.

Next, a conductive pattern is formed by applying a conductive paste to the ceramic green sheet. The conductive paste can be applied by various printing methods such as screen printing, for example. The conductive paste may contain, in addition to conductive particles, a known binder and a known solvent.

Then, a mother laminated body is prepared by laminating a plurality of ceramic green sheets on which the conductive pattern is not formed, the ceramic green sheet on which the conductive pattern corresponding to the first or second internal electrode is formed, and a plurality of ceramic green sheets on which the conductive pattern is not formed, in the mentioned order, and by pressing them in the laminated direction.

Next, a plurality of raw ceramic laminated bodies are prepared from the mother laminated body, by cutting the mother laminated body along imaginary cut lines on the mother laminated body. The mother laminated body may be cut by dicing or press cutting. Each of the raw ceramic laminated bodies may be subjected to barrel polishing to make the ridge portions and corner portions rounded.

The raw ceramic laminated body is then fired. In this firing step, the first and second internal electrodes are fired. The firing temperature can be set as appropriate depending on the types of the ceramic material and the conductive paste used. The firing temperature may be about 900° C. to about 1300° C., for example.

Then, the conductive paste is applied to opposite ends of the fired ceramic laminated body (ceramic main body), using a method such as dipping. In this case, the particle size of the metal powder in the conductive paste preferably is about 0.5 µm to about 2 µm, for example. This increases the contact area between the metal (Cu) contained in the external electrodes and the metal (Ni) contained in the internal electrodes, so as to promote the diffusion of the alloy on the internal electrodes on the end surfaces of the ceramic main body, and also promote necking of the metal powder contained in the external electrodes and necking of the alloy on an internal electrode and the alloy on an adjacent internal electrode. In this way, the alloy layers are preferably formed at the interfaces between the external electrodes, and the ceramic main body and the internal electrodes. Furthermore, a particle size of the glass powder in the conductive paste larger than the above-described particle size of the metal powder is used. That is, in the present preferred embodiment according to the present invention, by using the metal powder having a fine particle size and using the glass powder having a particle size larger than that of the metal powder, the specific surface area of the glass is significantly reduced as compared to the specific surface area of the metal powder, so as to allow the metal powder to be collected more easily, and the alloy layers to be formed more easily, at the interfaces between the external electrodes, and the ceramic main body and the internal electrodes.

Next, the conductive paste on the ceramic laminated body is hot-gas dried for approximately 10 minutes in an atmosphere at about 60° C. to about 180° C., for example.

The dried conductive paste is subsequently baked to form the external electrodes and the alloy layers.

The conductive paste used for forming the external electrodes contains the glass powder, the metal powder, a binder, a solvent, and the like. The aspect ratio of the metal powder in the conductive paste is preferably approximately 8 to 15, for example. This improves the continuity between the internal electrodes and the external electrodes. Furthermore, it is preferred to select a glass having a softening point higher than the temperature at which the metal of the internal electrodes diffuses into the metal of the external electrodes, and perform heat treatment at a temperature higher than the softening point of the glass. This causes the glass to be spaced away from the interfaces between the external electrodes, and the ceramic main body and the internal electrodes, which allows the alloy layers to be formed easily at the interfaces between the external electrodes, and the ceramic main body and the internal electrodes. For example, where the metal of the internal electrodes is Ni and the metal of the external electrodes is Cu, the temperature at which Ni diffuses into Cu is about 400° C. It is thus preferred to select a glass having a softening point of about 600° C. to about 700° C. and perform heat treatment at a temperature of about 780° C. to about 800° C., for example.

The temperature increase rate during firing of the external electrodes is preferably about 150° C./min to about 250° C./min.

The plating films are then formed on the external electrodes, thus manufacturing laminated ceramic capacitor 10.

In laminated ceramic capacitor 10, alloy layers 22a, 22b of the metal contained in internal electrodes 16a, 16b and the metal contained in external electrodes 20a, 20b are arranged at the interfaces between external electrodes 20a, 20b, and ceramic main body 12 and internal electrodes 16a, 16b, so as to increase the bonded area between the metal in internal electrodes 16a, 16b and the metal in external electrodes 20a, 20b. Consequently, the connection resistance between internal electrodes 16a, 16b and external electrodes 20a, 20b is significantly reduced, so as to significantly reduce the overall ESR in laminated ceramic capacitor 10.

First, as samples based on the present preferred embodiment of the present invention, samples of laminated ceramic capacitors 10 described above in which the particle sizes of metal powder and glass powder were varied were prepared in accordance with the specifications of below-shown electronic components.

The particle size of each of the metal powder and the glass powder refers to a particle size at a D50 value by particle size distribution measurement, namely, an integrated value of about 50% of a particle size distribution obtained by a laser diffraction/scattering method.

Specification of Electronic Components (Number n=10 for Each Set of Conditions)

Chip size (designed values): DL×DW×DT=1.0 mm×0.5 mm×0.15 mm

Metal of internal electrode: Ni

Dimension DE of folded portion of external electrode (electrode partial dimension DE of an external electrode formed on a main surface and a side surface of a ceramic main body): 200 µm to 400 µm (the target value is 300 µm)

Metal contained in conductive paste forming external electrode: Cu

Mean particle size of Cu (Cu powder): see the metal powder particle sizes shown in Tables 1 and 2

Aspect ratio of Cu powder: 10 (This aspect ratio was obtained by pounding Cu powders having the particle sizes shown in Tables 1 to 3)

Mean particle size of glass powder in conductive paste forming external electrode: see the glass powder particle sizes shown in Tables 1 and 2

Amount of metal in conductive paste forming external electrode: 73% by volume

Amount of metal in conductive paste forming external electrode: 27% by volume

Drying condition for conductive paste forming external electrode: hot-gas drying for 10 minutes at 100° C.

Firing conditions for external electrode: temperature increase rate is 196° C./min and firing temperature is 835° C.

Thickness of folded portion of external electrode: 8 μm to 13 μm (thickest portion) (the target value is 10 μm)

Thickness of end surface of external electrode (the thickness of a portion of an external electrode covering an end surface of the ceramic main body): 6 μm to 12 μm (thickest portion) (the target value is 9 μm)

Plating film: two layers of Ni plating (the target value is 3 μm) and Sn plating (the target value is 4 μm)

Additionally, as samples according to Comparative Example, samples were prepared using a conventional external electrode paste.

These samples were then examined for their coverage ratio of the alloy layers, the ESR, and the PCBT rejection rate (rejection rate based on humidity resistance), and the like, as described below.

The coverage ratio of an alloy layer is measured at a central portion of an external electrode where the amount of glass in the external electrode is the largest. First, a side surface of ceramic main body 12 is polished to a position where the width reduces to about ½. In the one external electrode on the end of the polished cross section, for a region that is about 1 μm forward in the direction from the end surface of the ceramic main body to the external electrode, the alloy and the glass are divided into white and black regions, respectively, using binarization. The area ratio of the white portions (alloy regions) is subsequently calculated using image processing. The length of the region to be binarized was set to about 30 μm or more, for example. Lastly, an average value was obtained from the values of the ten samples (for each set of conditions).

The ESR was measured as follows. Prior to the measurement, a laminated ceramic capacitor was subjected to heat treatment for an hour at about 150° C. in an air atmosphere. The laminated ceramic capacitor was then mounted on a substrate for measurement, and measured using a network analyzer after approximately 22 to 26 hours from the completion of the heat treatment. The measurement frequency was set to about 10 MHz. Lastly, an average value was obtained from the values of the ten samples (for each set of conditions), and a sample having about 48 mΩ or more was determined to be defective (NG).

For each sample, a humidity load test was performed as follows. Each sample was mounted on a glass epoxy substrate with eutectic solder. Each sample was then placed within a high-temperature high-humidity chamber at about 125° C. and a relative humidity of about 95% RH, and subjected to accelerated humidity testing under the conditions of DC2V and approximately 72 hours. A sample in which the insulation resistance value (IR value) decreased by two or more digits was determined to be a defective product (NG) in which the humidity resistance deteriorated.

For each sample, the exposed ratio of the internal electrodes was measured by obtaining the ratio of Ni to Ba, by observing the end surfaces of the ceramic main body prior to the formation of the external electrodes, using a scanning electron microscope (JCM-5700) at an acceleration voltage of 20 kV and 1500× magnification, and then using an EDX (energy dispersive X-ray analysis) apparatus attached to the scanning electron microscope. Here, the exposed ratio of the internal electrodes on the end surfaces of the ceramic main body was determined to be about 60% to about 80% as the range of ten values for each type of samples (for each set of conditions).

The foregoing measurement results are shown in Tables 1, 2 and 3.

TABLE 1

Particle size of metal powder: about 0.5 μm (according to a preferred embodiment of the present invention and the like)

| Metal powder particle size (μm) | 0.5 | 0.5 | 0.5 | 0.5 | 0.5 |
|---|---|---|---|---|---|
| Glass powder particle size (μm) | 0.5 | 1.0 | 1.5 | 2.0 | 2.5 |
| Ratio of glass/Cu powder particle size | 1.0 | 2.0 | 3.0 | 4.0 | 5.0 |
| Coverage ratio (%) of alloy layers | 50% | 72% | 77% | 80% | 82% |
| ESR (mΩ) | 55.9 (NG) | 43.0 | 45.0 | 42.0 | 41.0 |
| PCBT rejection rate (%) | 0% | 0% | 0% | 0% | 30% (NG) |
| Exposed ratio (%) of internal electrodes | 60-80% | 60-80% | 60-80% | 60-80% | 60-80% |

TABLE 2

Particle size of metal powder: 2.0 μm (according to a preferred embodiment of the present invention and the like)

| Metal powder particle size (μm) | 2.0 | 2.0 | 2.0 | 2.0 | 2.0 | 2.0 |
|---|---|---|---|---|---|---|
| Glass powder particle size (μm) | 1.0 | 1.5 | 2.0 | 3.0 | 4.0 | 5.0 |
| Ratio of glass/Cu powder particle size | 0.5 | 0.75 | 1.0 | 1.5 | 2.0 | 2.5 |
| Coverage ratio (%) of alloy layers | 45% | 69% | 74% | 77% | 80% | 82% |
| ESR (mΩ) | 56.1 (NG) | 51.4 (NG) | 46.0 | 45.0 | 42.0 | 41.0 |
| PCBT rejection rate (%) | 0% | 0% | 0% | 0% | 0% | 60% (NG) |
| Exposed ratio (%) of internal electrodes | 60-80% | 60-80% | 60-80% | 60-80% | 60-80% | 60-80% |

TABLE 3

Particle size of metal powder: 3.5 μm (according to Comparative Example)

| Metal powder particle size (μm) | 3.5 | 3.5 | 3.5 |
|---|---|---|---|
| Glass powder particle size (μm) | 1.0 | 3.5 | 5.5 |
| Ratio of glass/Cu powder particle size | 0.3 | 1.0 | 1.6 |

TABLE 3-continued

| Particle size of metal powder: 3.5 µm (according to Comparative Example) | | | |
|---|---|---|---|
| Coverage ratio (%) of alloy layers | 45% | 38% | 55% |
| ESR (mΩ) | 56.5 (NG) | 54.3 (NG) | 55.5 (NG) |
| Exposed ratio (%) of internal electrodes | 60-80% | 60-80% | 60-80% |

From the results shown in Table 1, it is assumed that when the particle size of the glass powder is too large relative to the particle size of the metal powder, glass does not function sufficiently as a sintering aid, so that the density of Cu decreases, and an entry path for moisture in the film is created. As a result, the IR deterioration is considered to occur in the PCBT test.

From the results shown in Table 2, it is assumed that when the particle size of the glass powder is too large relative to the particle size of the metal powder, glass does not function sufficiently as a sintering aid, so that the density of Cu decreases, and an entry path for moisture in the film is created. As a result, the IR deterioration is considered to occur in the PCBT test.

From the results shown in Table 3, when the particle size of the metal powder is large, no effect can be seen even if the size of the glass powder is varied. This is considered to be because the contact area between the metal powder contained in the external electrodes and the metal powder contained in the internal electrodes deceases, to reduce the diffusion of the alloy on the internal electrodes on the chip end surfaces.

In contrast, the samples according to the present preferred embodiment of the present invention are satisfactory in ESR.

Furthermore, when ratio $b$ of the glass/Cu powder particle size to particle size $a$ of the metal powder has the relations: $b \leq -1.3 \times a + 4.65$ and $b \geq -0.66 \times a + 2.32$, the samples are satisfactory not only in ESR but also in PCBT.

Furthermore, similar experiments were also conducted on samples that fall within the scope of the present invention, each having a chip size of DL×DW×DT=approximately 0.6 mm×0.3 mm×0.15 mm, and having a dimension DE of folded portion of external electrode (electrode partial dimension DE of an external electrode formed on a main surface and a side surface of a ceramic main body) of about 180 µm to about 320 µm (the target value was about 250 µm), for example. As a result, similar effects were obtained.

The foregoing results confirmed that when the alloy layers of the metal contained in the internal electrodes and the metal contained in the external electrodes are arranged at the interfaces between the external electrodes, and the ceramic main body and the internal electrodes, the bonded area between the metal contained in the internal electrodes and the metal contained in the external electrodes is increased, and the connection resistance between the internal electrodes and the external electrodes is reduced, resulting in a decrease in the overall ESR in the laminated ceramic capacitor.

While a dielectric ceramic preferably is used as the material of the ceramic main body in the above-described preferred embodiment and Experimental Examples, in the present invention, a piezoelectric ceramic such as a PZT-based ceramic, a semiconductor ceramic such as a spinel-based ceramic, or a magnetic ceramic such as ferrite can also be used as the material of the ceramic main body, depending on the type of the ceramic electronic component.

When a piezoelectric ceramic is used as the ceramic main body of the ceramic electronic component, the ceramic electronic component defines and functions as a piezoelectric component, when a semiconductor ceramic is used, the ceramic electronic component defines and functions as a thermistor, and when a magnetic ceramic is used, the ceramic electronic component defines and functions as an inductor. It is noted, however, that when the ceramic electronic component is intended to define and function as an inductor, the internal electrodes are replaced with a coil-shaped conductor.

Furthermore, while the external electrodes preferably are provided also on the side surfaces of the ceramic main body in the above-described preferred embodiment and Experimental Examples, they may not be formed on the side surfaces of the ceramic main body.

The ceramic electronic components according to various preferred embodiments of the present invention are particularly suitable for use as laminated ceramic capacitors and laminated ceramic inductors, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A ceramic electronic component comprising:
a ceramic main body including a plurality of laminated ceramic layers;
internal electrodes disposed inside the ceramic main body, the internal electrodes including respective exposed portions exposed on an end surface of the ceramic main body;
an external electrode arranged on the end surface of the ceramic main body so as to be electrically connected with each of the exposed portions of the internal electrodes; and
a plating film arranged on the external electrode; wherein
the external electrode includes a metal medium in which metal powder is integrated and a glass medium in which glass powder is integrated;
an alloy layer of a metal contained in the external electrode and a metal contained in each of the internal electrodes is located at an interface between the external electrode, and the ceramic main body and the internal electrodes so as to extend across adjacent exposed portions of the internal electrodes; and
the metal medium and the glass medium are located between the alloy layer and the plating film.

2. The ceramic electronic component according to claim 1, wherein the metal medium is made of Cu.

3. The ceramic electronic component according to claim 1, wherein the alloy layer is a Ni—Cu alloy layer.

4. The ceramic electronic component according to claim 1, wherein a coverage ratio of the alloy layer on the end surface of the ceramic main body is about 72% or more.

5. The ceramic electronic component according to claim 1, wherein a distance between exposed portions of a plurality of the internal electrodes adjacent to each other on the end surface of the ceramic main body is about 4 mm or less.

6. The ceramic electronic component according to claim 1, wherein an exposed ratio of the internal electrodes on the end surface of the ceramic main body is about 60% to about 80%.

7. The ceramic electronic component according to claim 1, wherein the metal powder of the metal medium of the external electrode has an aspect ratio of approximately 8 to 15.

8. The ceramic electronic component according to claim 1, wherein the metal medium is present nearer to a surface of the external electrode than the alloy layer located between the external electrode, and the ceramic main body and the internal electrodes.

9. The ceramic electronic component according to claim 1, wherein a proportion of the metal medium in the external electrode is about 70% to about 75% by volume.

10. The ceramic electronic component according to claim 1, wherein a proportion of the glass medium in the external electrode is about 25% to about 30% by volume.

11. The ceramic electronic component according to claim 1, wherein the plating film includes at least two plating films including a Ni plating film and a Sn plating film.

12. The ceramic electronic component according to claim 1, wherein the ceramic electronic component is one of a capacitor, a piezoelectric component, a thermistor, and an inductor.

13. The ceramic electronic component according to claim 1, wherein the external electrode is arranged on a side surface of the ceramic main body.

14. A method for manufacturing the ceramic electronic component according to claim 1, comprising the steps of:
preparing the ceramic main body in which the internal electrodes are disposed;
applying, to the end surface of the ceramic main body on which the exposed portions of the internal electrodes are exposed, a conductive paste containing metal powder having a particle size of about 0.5 µm to about 2 µm and glass powder having a particle size larger than the particle size of the metal powder; and
heat-treating the conductive paste to form the external electrode on the end surface of the ceramic main body on which the exposed portions of the internal electrodes are exposed, and to form the alloy layer at the interface between the external electrode, and the ceramic main body and the internal electrodes.

15. The method according to claim 14, wherein
the glass powder has a softening point higher than a temperature at which the metal contained in the internal electrodes diffuses into the metal contained in the external electrode; and
a heat-treatment temperature for the conductive paste is higher than the softening point of the glass powder.

16. The method according to claim 14, wherein the metal medium is made of Cu.

17. The method according to claim 14, wherein the alloy layer is a Ni—Cu alloy layer.

18. The method according to claim 14, wherein a coverage ratio of the alloy layer on the end surface of the ceramic main body is about 72% or more.

19. The method according to claim 14, wherein a distance between exposed portions of a plurality of the internal electrodes adjacent to each other on the end surface of the ceramic main body is about 4 mm or less.

20. The method according to claim 14, wherein an exposed ratio of the internal electrodes on the end surface of the ceramic main body is about 60% to about 80%.

* * * * *